United States Patent
Roberts, IV et al.

(10) Patent No.: US 7,598,460 B2
(45) Date of Patent: Oct. 6, 2009

(54) RADIATION SHIELDING WOOD OR LAMINATE FACED DOOR HAVING A HIGH FIRE RATING AND METHOD FOR MAKING SAME

(76) Inventors: Leonard Pascal Roberts, IV, 18 Laurchris SE., Rome, GA (US) 30161; Stephen Wesley Ballard, 24 Club View Dr. SE., Rome, GA (US) 30161

(*) Notice: Subject to any disclaimer, the term of this patent is extended or adjusted under 35 U.S.C. 154(b) by 323 days.

(21) Appl. No.: 11/260,168

(22) Filed: Oct. 28, 2005

(65) Prior Publication Data

US 2007/0095570 A1    May 3, 2007

(51) Int. Cl.
*H05K 9/00*    (2006.01)
*E04C 2/54*    (2006.01)

(52) U.S. Cl. .................. 174/382; 52/784.11

(58) Field of Classification Search .......... 174/377, 174/382; 361/816, 818, 800; 52/784.11, 52/783.13
See application file for complete search history.

(56) References Cited

U.S. PATENT DOCUMENTS

| | | | |
|---|---|---|---|
| 4,104,828 A * | 8/1978 | Naslund et al. | 49/399 |
| 4,357,541 A | 11/1982 | Ernst | |
| 4,613,530 A | 9/1986 | Hood | |
| 4,686,804 A | 8/1987 | Smith | |
| 4,699,752 A | 10/1987 | Brahm | |
| 4,801,423 A | 1/1989 | Warren | |
| 4,833,335 A | 5/1989 | Mcginley | |
| 4,932,553 A | 6/1990 | Reich | |
| 5,217,764 A * | 6/1993 | Eich | 428/34 |
| 5,251,245 A | 10/1993 | Evans | |
| 5,786,547 A * | 7/1998 | Zielinski | 174/375 |
| 5,800,651 A | 9/1998 | Williamson | |
| 5,816,017 A | 10/1998 | Hunt | |
| 6,434,899 B1 | 8/2002 | Fortin | |

(Continued)

FOREIGN PATENT DOCUMENTS

EP    1125304 B1    12/2004

(Continued)

OTHER PUBLICATIONS

Radiation Protection Products, Inc., Advertisement: "Radiation Shielding: Door Ordering Info," 2 pages, copyright 2005.

(Continued)

*Primary Examiner*—Hung V Ngo
(74) *Attorney, Agent, or Firm*—Hunton & Williams LLP

(57) ABSTRACT

A radiation shielding wood or laminate faced door having a high fire rating and method for making same are disclosed. The radiation shielding door comprises a non-combustible core having a first face, a second face. A supporting material is in contact with the non-combustible core. A first radiation shield is in contact with the first face of the non-combustible core. An intumescent material is in contact with the supporting material. The method of manufacturing a radiation shielding door includes the steps of providing an non-combustible core having a first face, a second face; securing a supporting material to the non-combustible core; adhering a first radiation shield to the first face of the non-combustible core; and providing an intumescent material to the supporting material.

9 Claims, 8 Drawing Sheets

U.S. PATENT DOCUMENTS

| | | | |
|---|---|---|---|
| 6,745,526 | B1 | 6/2004 | Autovino |
| 7,028,431 | B2 * | 4/2006 | Tlemcani et al. ............... 49/8 |
| 7,059,092 | B2 * | 6/2006 | Harkins et al. ............... 52/232 |
| 7,335,838 | B2 * | 2/2008 | Simola ............... 174/386 |
| 2002/0162298 | A1 | 11/2002 | Churchill |
| 2003/0004247 | A1 | 1/2003 | Destandau et al. |
| 2003/0213178 | A1 * | 11/2003 | Fanucci et al. ............... 49/371 |
| 2004/0036191 | A1 | 2/2004 | Rodda |
| 2004/0045219 | A1 * | 3/2004 | Tlemcani et al. ............... 49/7 |
| 2005/0031843 | A1 * | 2/2005 | Robinson et al. ......... 428/293.4 |
| 2005/0166473 | A1 | 8/2005 | Jorg |
| 2007/0068101 | A1 * | 3/2007 | Weir et al. ............... 52/302.1 |

FOREIGN PATENT DOCUMENTS

| | | |
|---|---|---|
| GB | 0938159 A | 10/1963 |
| GB | 1602010 A | 11/1981 |
| JP | 2077697 | 3/1990 |
| JP | 09033696 A | 2/1997 |
| WO | WO 9731166 A1 | 8/1997 |
| WO | WO 9810696 A1 | 3/1998 |
| WO | WO 2004003934 A1 | 1/2004 |
| WO | WO 2005065623 A2 | 7/2005 |

OTHER PUBLICATIONS

PLI/Patson Lead, Inc., Advertisement: "Radiation Shielding," 2 pages.

A&L Shielding, Technical/CSI Specification 13090: Radiation Protection: "Radiation Shielding Materials," 3 pages.

Specification: Mammography Shielding Guidance, published by the Department of Community Health, State of Michigan, 3 pages, copyright 2001-2005.

MarShield's, General Information and Technical Specifications: Lead Lined Doors, Windows and Frames, 7 pages.

Marshfield DoorSystems, "Section 08210—Flush Wood Doors, Marshfield DoorSystems' Flush Wood Door Specification," 8 pages, copyright 2005.

The Swedish Radiation Protection Institute, "The Swedish Radiation Protection Institute's Regulations on Radiation Shielding of X-ray Installations for Medical Diagnostics," 5 pages, issued on Mar. 22, 1991.

Specification: Section 13091, Lead Radiation Shielding, 12 pages.

A&L Shielding, Specification: CoreClad © Lead Lined Wood Doors—45 & 60 Min (Positive Pressure per UBC Jul. 2, 1997 with Concealed Intumescent), 2 pages, Aug. 2005.

A&L Shielding, Technical Data: CoreClad® Lead Lined Wood Doors—45 & 60 Min (Positive Pressure per UBC Jul. 2, 1997 with Concealed Intumescent (1), 1 page, Aug. 2005.

A&L Shielding, Product Specification: CoreClad® Series Door, Lead Lined Wood Door—45 & 60 Min, 1 page, Jan. 12, 2005.

A&L Shielding, Installation Instructions for 45- and 60-Minute Positive Pressure and Smoke Control Wood Doors (UBC 7-2 (97) Part 1 & 2, 9 pages, Dec. 22, 2004.

* cited by examiner

RADIATION SHIELDING WOOD OR LAMINATE FACED DOOR HAVING A HIGH FIRE RATING AND METHOD FOR MAKING SAME

BACKGROUND OF THE INVENTION

1. Field of the Invention

The present invention generally relates to a radiation shielding door having a fire rating, and more particularly, to a radiation shielding door having a high fire rating and method for making same.

2. Description of the Related Art

Building codes require that doors to be installed in certain building positions need to have a particular fire rating that is measured in time, such as a 20 minute door, a 45 minute door, a one-hour door, a one and one-half hour door, etc. Doors are given a fire rating in accordance with a standard test specification. There are a number of national testing laboratories performing these tests, all of which lead to a "listing" or certification of conformance. Three such listing agencies in the United States are Factory Mutual, Intertek Testing Services, and Underwriters Laboratories.

In conducting such tests, doors are mounted in an opening of a fireproof wall and then exposed on one side to a predetermined time-temperature rise function. The time that a door can withstand the heat before it is penetrated by burning determines its fire rating. A component of the test is a high pressure water stream applied to the door for a set period of time immediately after the door is removed from the test furnace.

An example of a door that provides such a fire rating is disclosed in U.S. Pat. No. 4,104,828, the disclosure of which is incorporated by reference in its entirety. U.S. Pat. No. 4,104,828 discloses a solid fire door having three basic components: a mineral core, wood edges attached around the core (the vertical edges being referred to as stiles and the horizontal edges as rails), and thin facing material covering both sides of the door for its appearance.

SUMMARY OF THE INVENTION

It is a technical advantage of the present invention that a door for radiation shielding purposes with a fire rating of forty-five minutes or one hour is provided. It is another technical advantage of the present invention that a method of manufacturing a radiation shielding door having a fire rating is provided. It is another technical advantage of the present invention that a method of making a multi-layer material comprising a layer of radiation shield and a layer of a non-combustible material is disclosed.

It is another technical advantage that a door for radiation shielding purposes with a fire rating of forty-five minutes or one hour is provided. It is another technical advantage of the present invention that a non-combustible core is used. It is yet another technical advantage of the present invention that lead sheets are used as a component of the door to shield from radiation.

According to one embodiment of the present invention, a radiation shielding door having a fire rating is disclosed. The radiation shielding door comprises a non-combustible core having a first face, a second face. A supporting material is in contact with the non-combustible core. A first radiation shield is in contact with the first face of the non-combustible core. An intumescent material is in contact with the supporting material.

A second radiation shield may be provided in contact with the second face of the non-combustible core. A first cover and a second cover may be provided in contact with the first and second radiation shields, respectively.

The non-combustible core may comprise a mineral core, and may further comprise calcium silicate. The radiation shield may comprise lead. The supporting material may comprise Tectonite™. The radiation shielding door may have a fire rating of at least 45 minutes, and may have a fire rating of at least one hour.

According to another embodiment of the present invention, a method of manufacturing a radiation shielding door having a fire rating is disclosed. The method includes the steps of providing an non-combustible core having a first face, a second face; securing a supporting material to the non-combustible core; adhering a first radiation shield to the first face of the non-combustible core; and providing an intumescent material to the supporting material.

The method may further include the step of adhering a second radiation shield to the second face of the non-combustible core; adhering a first cover to the first radiation shield; and adhering a second cover to the second radiation shield.

The non-combustible core may comprise a mineral core, and may further comprise calcium silicate. The radiation shield may comprise lead. The supporting material may comprise Tectonite™. The radiation shielding door may have a fire rating of at least 45 minutes, and may have a fire rating of at least one hour.

According to yet another embodiment of the present invention, a method of making a multi-layer material comprising a layer of radiation shield and a layer of a non-combustible material is disclosed. The method includes providing a layer of a cross linking polyvinyl acetate emulsion adhesive between the radiation shield layer and the non-combustible material layer. The adhesive may be Multibond 2000. The multi-layer material may include a cover layer in contact with the side of the radiation shield layer opposite to that which is in contact with the non-combustible material layer. A layer of adhesive may be provided between the cover layer and the radiation shield layer.

The radiation shield layer may comprise lead. The non-combustible material layer may comprise a mineral core, and may further comprise calcium silicate.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF PREFERRED EMBODIMENTS

Figure 1:
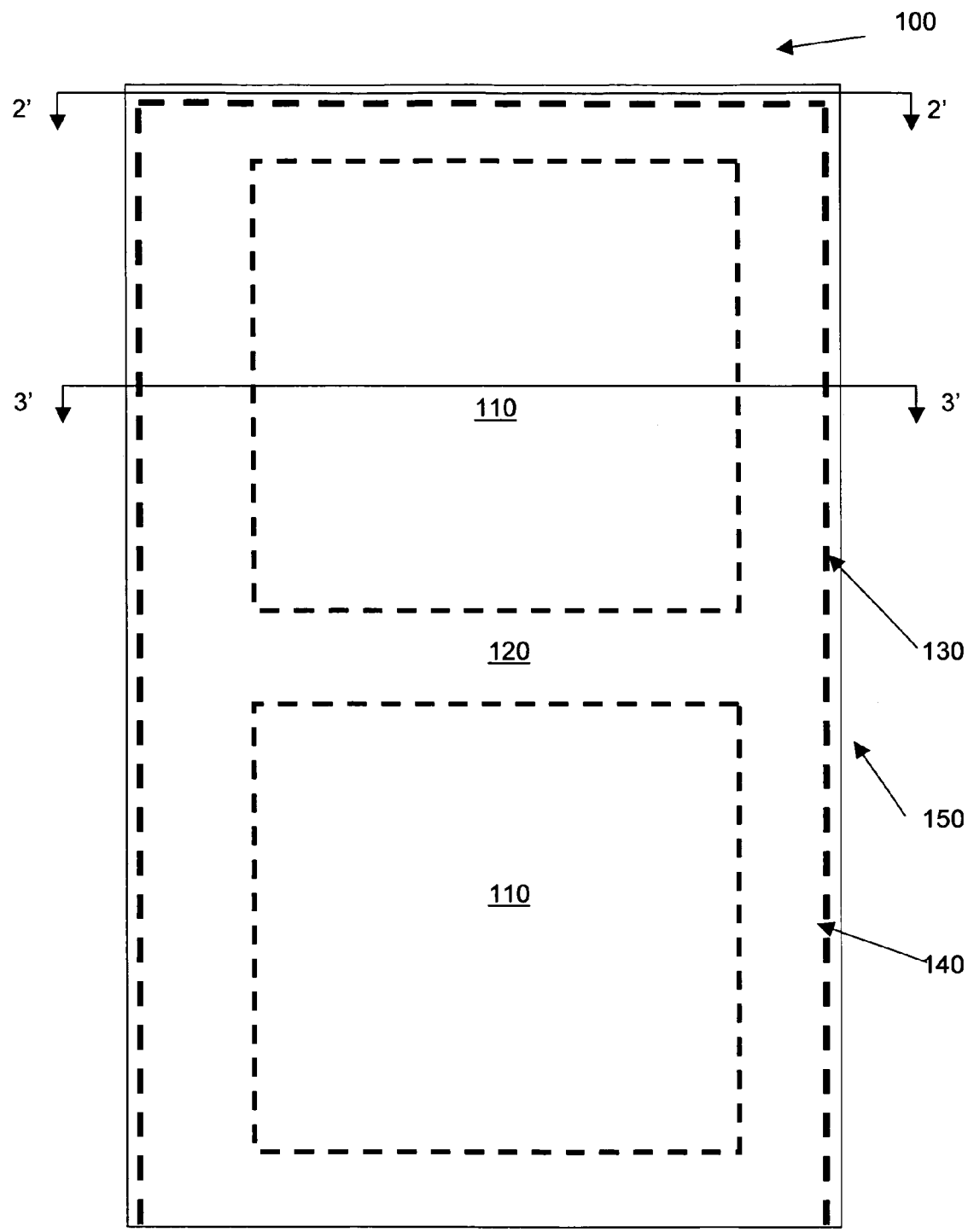
FIG. 1 is a front view of a radiation shielding fire rated door according to one embodiment of the present invention showing pertinent interior components with dotted lines.

Preferred embodiments of the present invention and their advantages may be understood by referring to FIGS. 1-8, wherein like reference numerals refer to like elements.

As used herein, the term "stiles" refers to the vertical edges of the door, or it can be used to refer to a laminate that constitutes the vertical edges of the door. The term "rails" refers to the horizontal edges of the door, or it can be used to refer to a laminate that constitutes the horizontal edges of the door.

Figure 2:
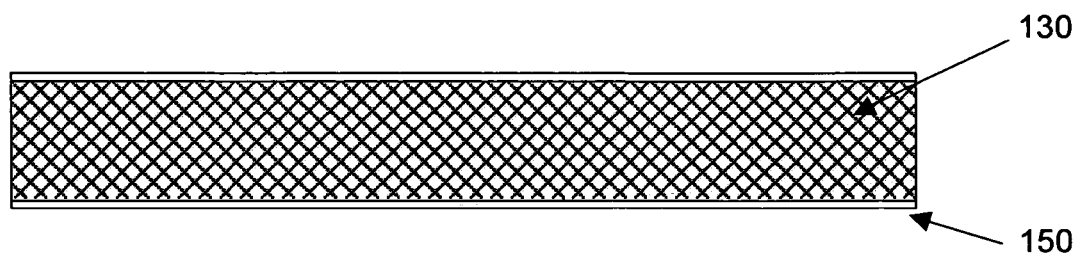
FIG. 2 is a sectional view along line 2'-2' of a radiation shielding fire rated door according to one embodiment of the present invention.
Figure 3:
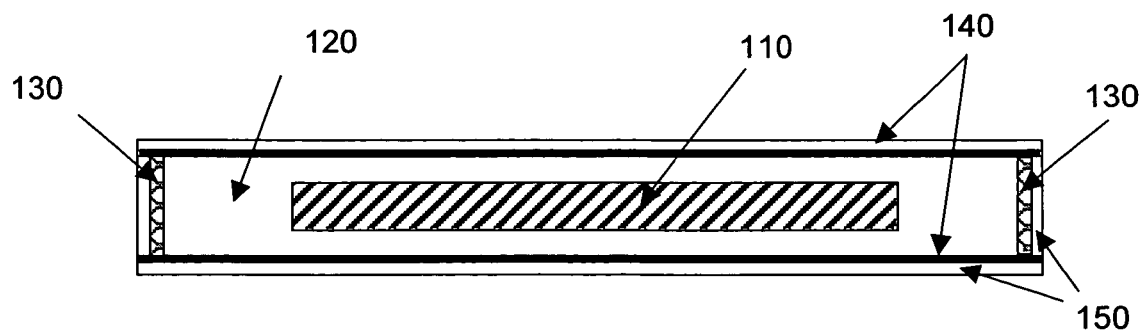
FIG. 3 is a sectional view along line 3'-3' of a radiation shielding fire rated door according to one embodiment of the present invention.

Referring to FIG. 1, a view of a core of fire door 100 is provided. FIG. 2 depicts a view of the core of door 100 along section 2'-2'. FIG. 3 depicts a view of the core of door 100 along section line 3'-3'. Generally, fire door 100 includes non-combustible core 110 and supporting structure 120. Intumescent material 130 is provided on the outer surfaces of supporting structure 120. Intumescent material 130 may also include graphite.

In one embodiment, non-combustible core 110 may comprise a mineral core. For example, a calcium silicate mineral block may be used, and is available from Marshfield Door Systems, Inc., Marshfield, Wis. 54449. Although two slabs of non-combustible core 110 are illustrated in FIG. 1, a single, larger slab may also be used. Non-combustible core 110 has a thickness necessary to provide the desired fire rating, e.g., about 1¼ inch to about 1¾ inch for a fire rating of about one hour. In one embodiment, non-combustible core 110 has a thickness from about 1.458 inch to about 1.500 inch.

Supporting structure 120 provides the necessary support for non-combustible core 110. In one embodiment, supporting structure 120 is in contact with the edges of non-combustible core 110.

A strip of supporting structure 120 may be provided near the center of door 100 in order to facilitate the installation of door locks and other hardware.

In one embodiment, supporting structure 120 has a width that is suitable to provide sufficient support for non-combustible core 110. This may be due to the characteristics of non-combustible core 110, such as its weight, dimensions, malleability, etc. In one embodiment, supporting structure has a width of at least 5 inches. In other words, approximately at least the outermost 5 inches of door 100 is comprised by supporting structure 120. Depending on the type and weight of non-combustible core 110, other amounts and/or widths for supporting structure 120 may be used.

In one embodiment, Tectonite™, a strong, low heat transferring, light mineral based material available from Warm Springs Composites, Warm Springs, Oreg. may be used to form the supporting structure. Tectonite™ is a non-combustible artificial material, and may surround non-combustible core 110. Additional Tectonite™ may be provided as necessary or required. In addition, Tectonite™ has excellent tooling qualities, and allows for door hardware, such as hinges, locks, etc. to be attached to door 100. Any other suitable material may be used to form the supporting structure.

Intumescent material 130 is provided to door 100 to provide additional fire protection. In one embodiment, intumescent material 130 is provided in the door stiles and the door rails. In one embodiment, intumescent material 130 may be provided in the door stiles and only in the top door rail. Intumescent material 130 may be provided in a channel in supporting structure 120 or in a channel formed between supporting structure 120 and cover 150. This will be illustrated in FIG. 6b, below. Preferably, intumescent material 130 is covered by cover 150, as will be discussed below.

An example of a suitable intumescent material 130 is Palusol®, available from BASF, which is essentially sodium silicate encapsulated in a rigid, thermoplastic profile. Other suitable intumescent materials may be used, such as Intumet™, available from Zero International. Intumet™ is a rubber-matrix material that begins intumescing at the relatively low temperatures where organic materials begin to emit combustible and noxious gases. It expands gradually with low force and forms a firm char.

When exposed to heat, intumescent material 130 preferably expands to seal door 100 to a door frame (not shown). In one embodiment, cover 150 will preferably disintegrate due to the heat, allowing intumescent material 130 to expand to seal the edges of door 100.

Radiation shield 140 is provided to door 100. In one embodiment, radiation shield 140 is provided on both sides of non-combustible core 110. In another embodiment, radiation shield may be provided on only one side of non-combustible core 110.

Preferably, radiation shield 140 comprises a sheet of substantially pure lead. In one embodiment, the lead meets Federal Specification QQ-L-201F, Grade C, and is at least 99.97 percent pure.

The thickness of radiation shield 140 may vary depending on various factors, including the proximity to the source of radiation and the type of radiation. If two lead sheets are used, each preferably has at least half the specified thickness for the door. For example, if a total of ¼ inch thickness is required, each lead sheet would have a thickness of at least ⅛ inch. In other embodiments, if radiation shield 140 is provided on only one side of non-combustible core 110, a ¼ inch thick sheet of lead may be provided on only one side of non-combustible core 110.

In one embodiment, the radiation shield 140 is provided on both sides of core 110, and each shield 140 has a thickness of between about 1/64 of an inch to about ¼ inch, for a total thickness (both shields combined) of between about 1/32 inch to about ½ inch. Other thicknesses may be used which may be dictated by a particular environment in which the door is used.

Cover 150 may be provided over intumescent material 130 and over radiation shield 140. Cover 150 provides "door skins" to the front and back surfaces of the door, as well as a cover around the door stiles and door rails. In one embodiment, cover 150 may be a hardwood veneer or plastic laminate that is aesthetically pleasing. Cover 150 has a thickness of about 0.100 inch to about 0.110 inch before trimming. For example, a suitable cover is a hardwood wood veneer, available from Birchwood Inc., Birchwood, Wis. Other materials may be used.

The edges of door 100 may be chamfered or beveled as necessary.

A window (not shown) with radiation shielding may be provided in door 100 as required.

Doors may be secured to a frame in a manner known to those of ordinary skill in the art.

Figure 4:
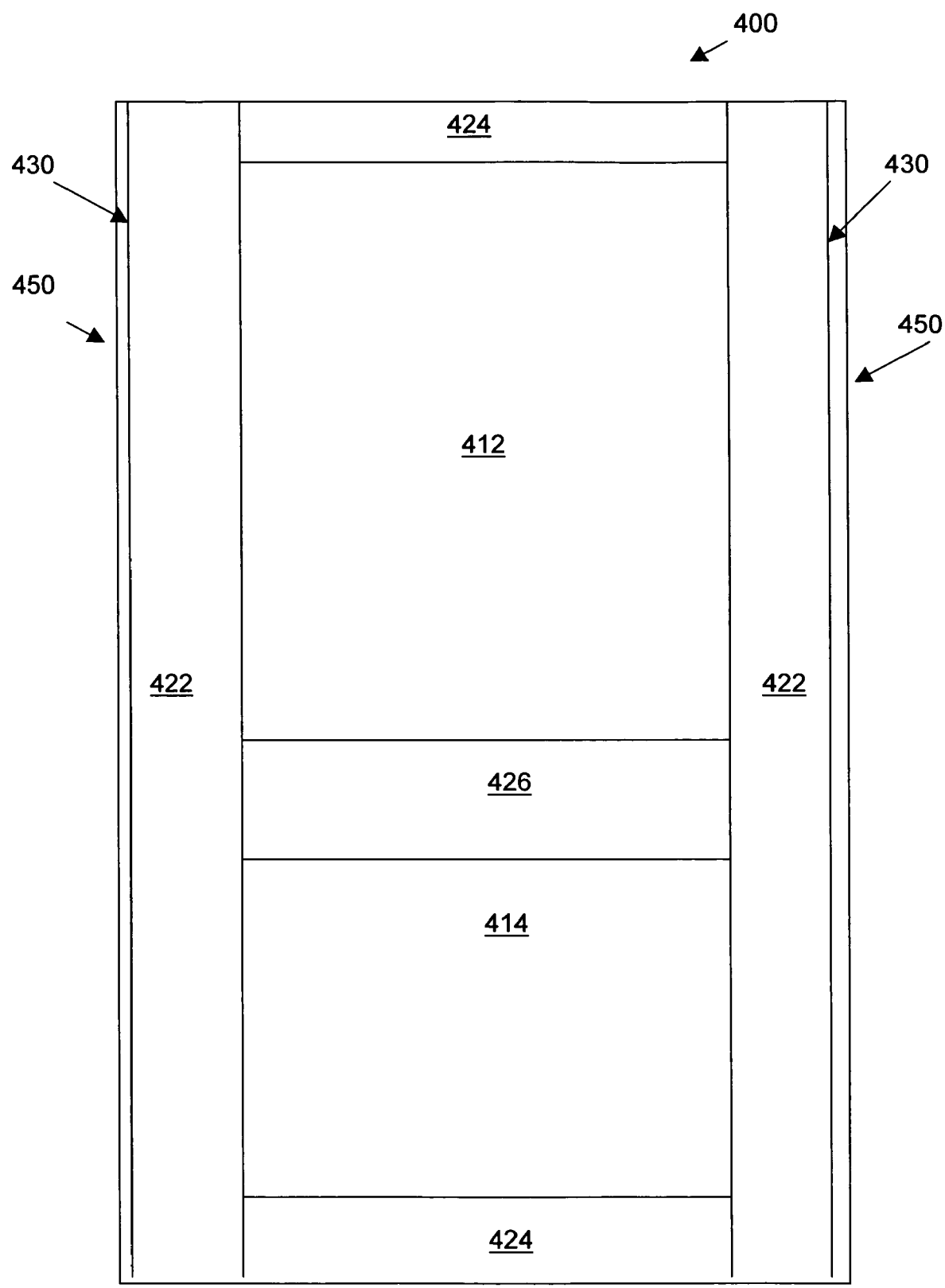
FIG. 4 is a schematic of the radiation shielding fire rated door according to another embodiment of the present invention.

FIG. 4 depicts an arrangement of non-combustible core 412 and 414, supporting structure 422, 424, and 426, and 430 in door 400 according to another embodiment of the invention. According to one embodiment, door 400 has a height of 8 feet 0 inches, and a width of 4 feet and 1/16 inch. In this embodiment, supporting structure 422 may have a width of between 1 and 3/8 inch and 8 inches, and preferably has a width of 5 and 1/2 inches. Supporting structure 424 has a height of between 4 and 6 inches, and preferably a height of 5 inches. Supporting structure 426 has a height between 5 and 12 inches, and preferably a height of 10 inches, or it may not be provided.

Note that, in this embodiment, non-combustible core 412 and 414 have different dimensions. This is so that a doorknob can be located at an appropriate position. Thus, supporting structure 426 may be positioned in door 400 accordingly. For example, structure 426 may be positioned with its centerline at 41" from the bottom of the door, but this may vary as needed.

Intumescent material 430 has a thickness of between 1/16 inch and 1/2 inch, and, in one embodiment, 1/8 inch. Cover 450, such as a hardwood veneer or plastic laminate, covers intumescent material 430 in the stiles of door 400, and preferably has a thickness of 5/16 inch before trimming. After door 400 is trimmed to finished size, cover 450 may have a thickness of less than 1/4 inch.

Door 100 may be manufactured as follows. Non-combustible core 110 is provided with supporting material 120 as necessary and desired. The specified amount of radiation shield 140 is then provided. In one embodiment, radiation shield 140 is attached (or bonded) to non-combustible core 110 and supporting material 120 with an adhesive (or glue). Any suitable adhesive may be used. For example, glues known as a shelf stable, one-component (pre-catalyzed), cross linking polyvinyl acetate emulsion adhesive may be used. An example of such a glue is Multibond 2000, available from Franklin International, Columbus, Ohio. During the bonding process, pressure must be applied to radiation shield 140 and non-combustible core 110, and to cover 150.

In one embodiment, it may be necessary to pre-treat the lead sheets in order to insure proper bonding of the lead sheets to non-combustible core 110 and cover 150. This treatment process involves flattening the lead surfaces and then thoroughly cleaning the lead surfaces. In one embodiment, the surfaces of the lead sheets are flattened by any suitable mechanical means, such as a hammer and a block. Other suitable mechanical means may also be used.

Once the surfaces of the lead sheets are flattened, surface impurities are removed. In one embodiment, a non-abrasive cloth that has been soaked with certain chemical products, such as denatured alcohol, may be used to remove surface impurities on the lead.

In conjunction with the bonding of radiation shield 140 to non-combustible core 110, cover 150 for the front and rear of door 100 may be bonded to radiation shield 140. Any suitable glue may be used, such as a shelf-stable, one-component (pre-catalyzed), cross-linking polyvinyl acetate emulsion adhesive. An example of such a glue is Multibond 2000, available from Franklin International, Columbus, Ohio.

Intumescent material 130 is then provided to the door stiles and door rails. In one embodiment, intumescent material 130 is provided to the door stiles and the top door rail. Intumescent material 130 is then covered with cover 150. In one embodiment, Palusol® is provided in the stiles, and Intument™ is provided in the top rails.

In one embodiment, cover 150 is only provided over intumescent material 130 in the door stiles, but not in the door rails. Cover 150 for the door stiles are usually made of a suitable hard wood veneer or plastic laminate and have a thickness of about 0.1 to about 0.25 inch.

The radiation shielding door of this invention withstands the industry standard minimum 45 minute and up to 60 minute fire test as administered by Intertek Testing Services.

Figure 5:
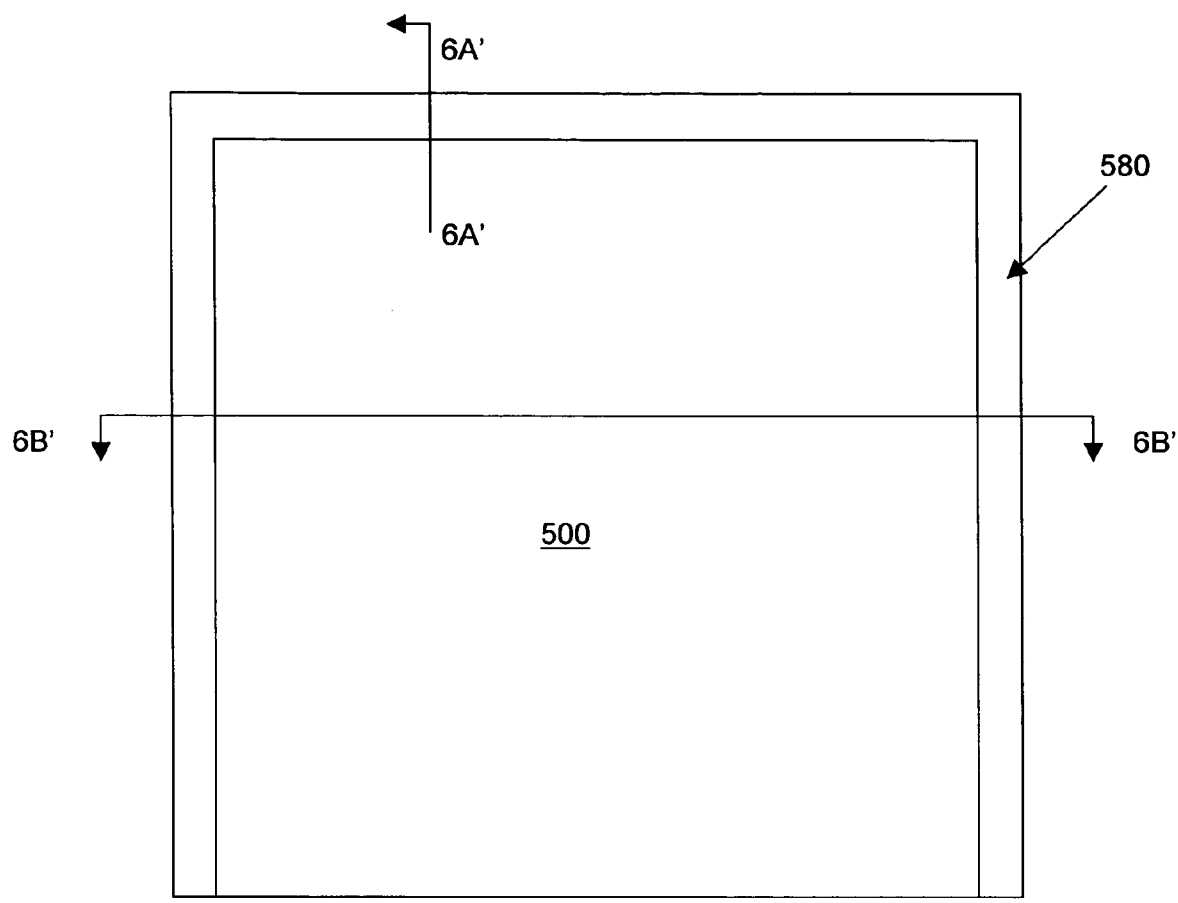
FIG. 5 is a front view of a half scale radiation shielding fire rated door according to another embodiment of the present invention.
Figure 6A:
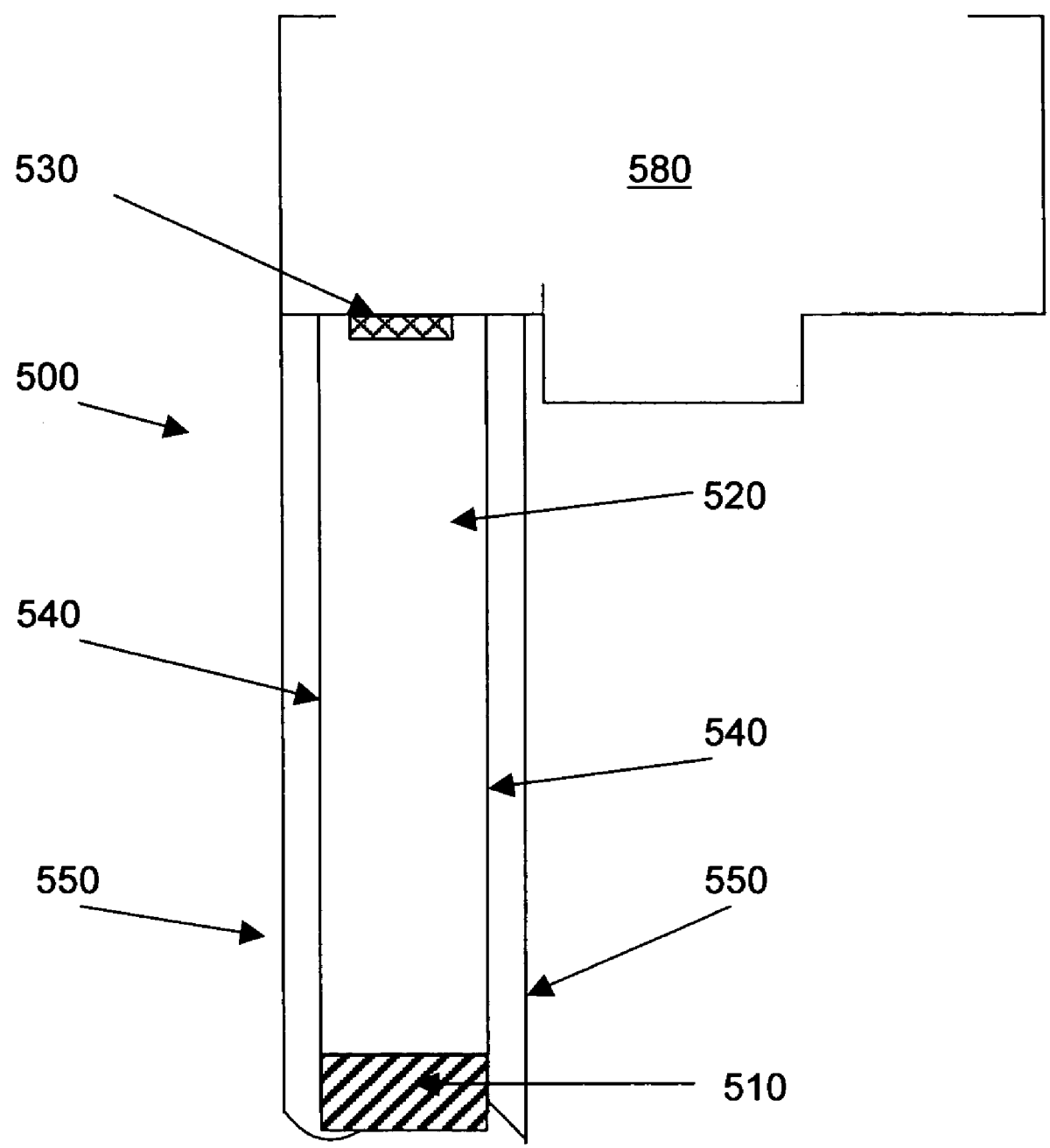
FIG. 6a is a section view of the door of FIG. 5 taken along line 6a'-6a'.
Figure 6B:
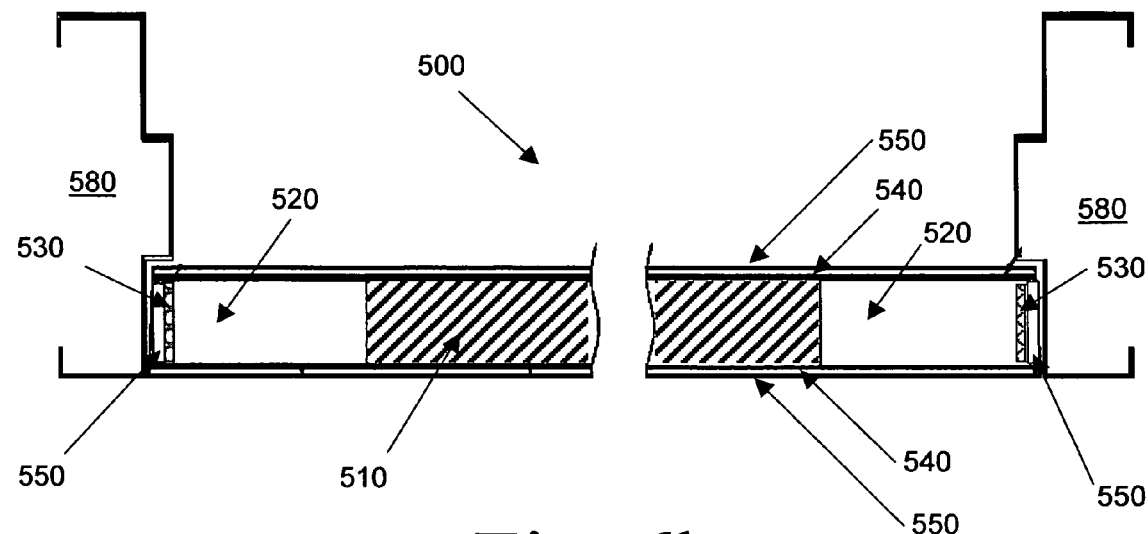
FIG. 6b is a section view of the door of FIG. 5 taken along line 6b'-6b'.
Figure 6C:
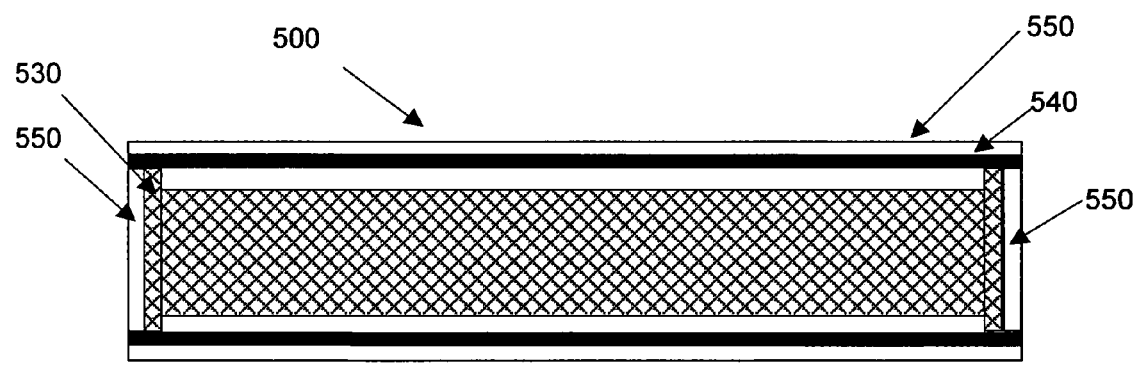
FIG. 6c is view of the top of the door of FIG. 5.

FIG. 5 depicts a half-scale door according to another embodiment of the present invention, and FIGS. 6a-6c depict sectional views of door 500. Door 500 is provided in frame 580, and includes non-combustible core 510, supporting material 520, intumescent material 530, radiation shield 540, and covering 550. Note that FIG. 6c illustrates a top view of door 500 that has cover 550 removed from its top rail.

Figure 7:
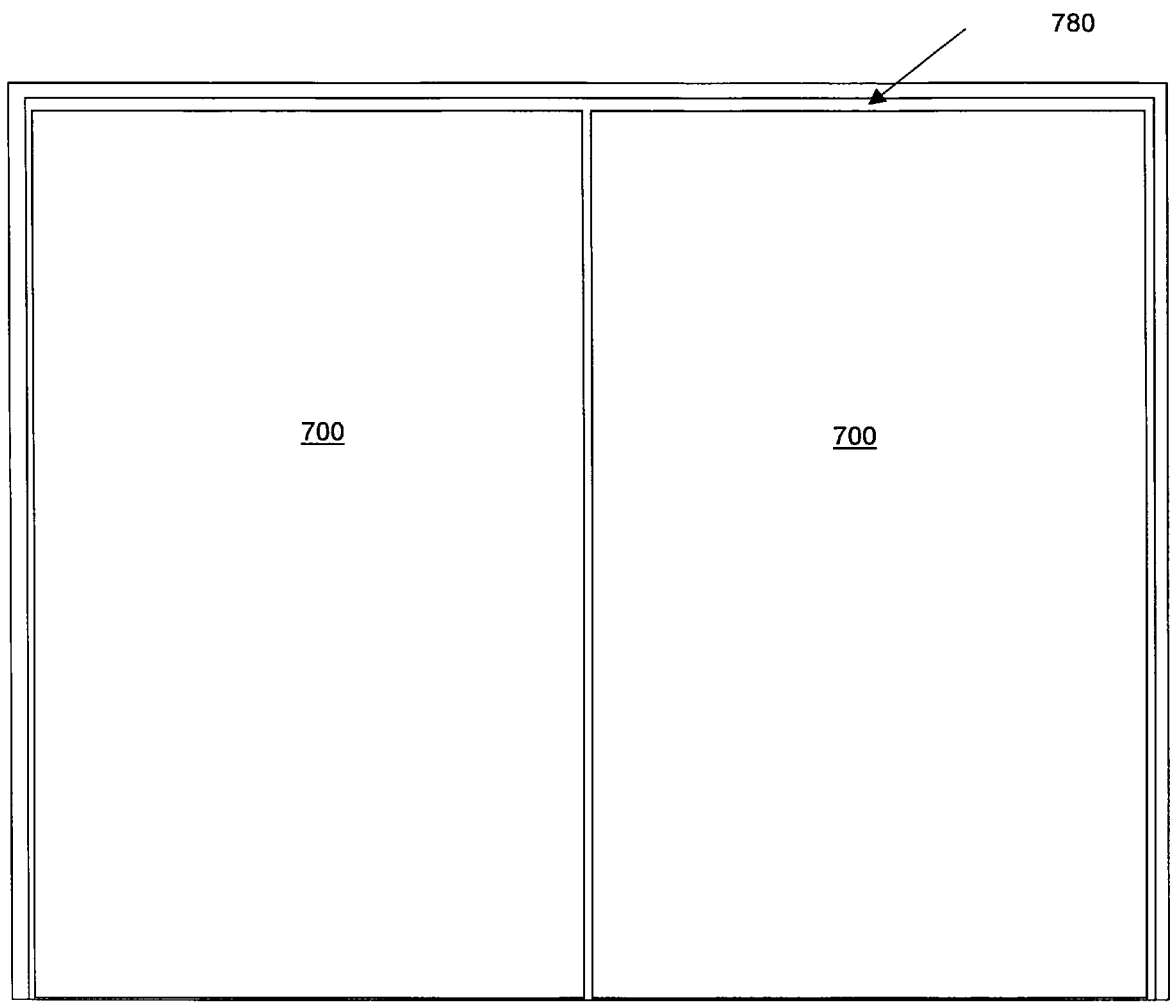
FIG. 7 is a front view of a pair of radiation shielding fire rated doors according to another embodiment of the present invention.

FIG. 7 depicts a pair of doors according to another embodiment of the present invention. Doors 700 are constructed in a similar manner as door 100.

Figure 8:
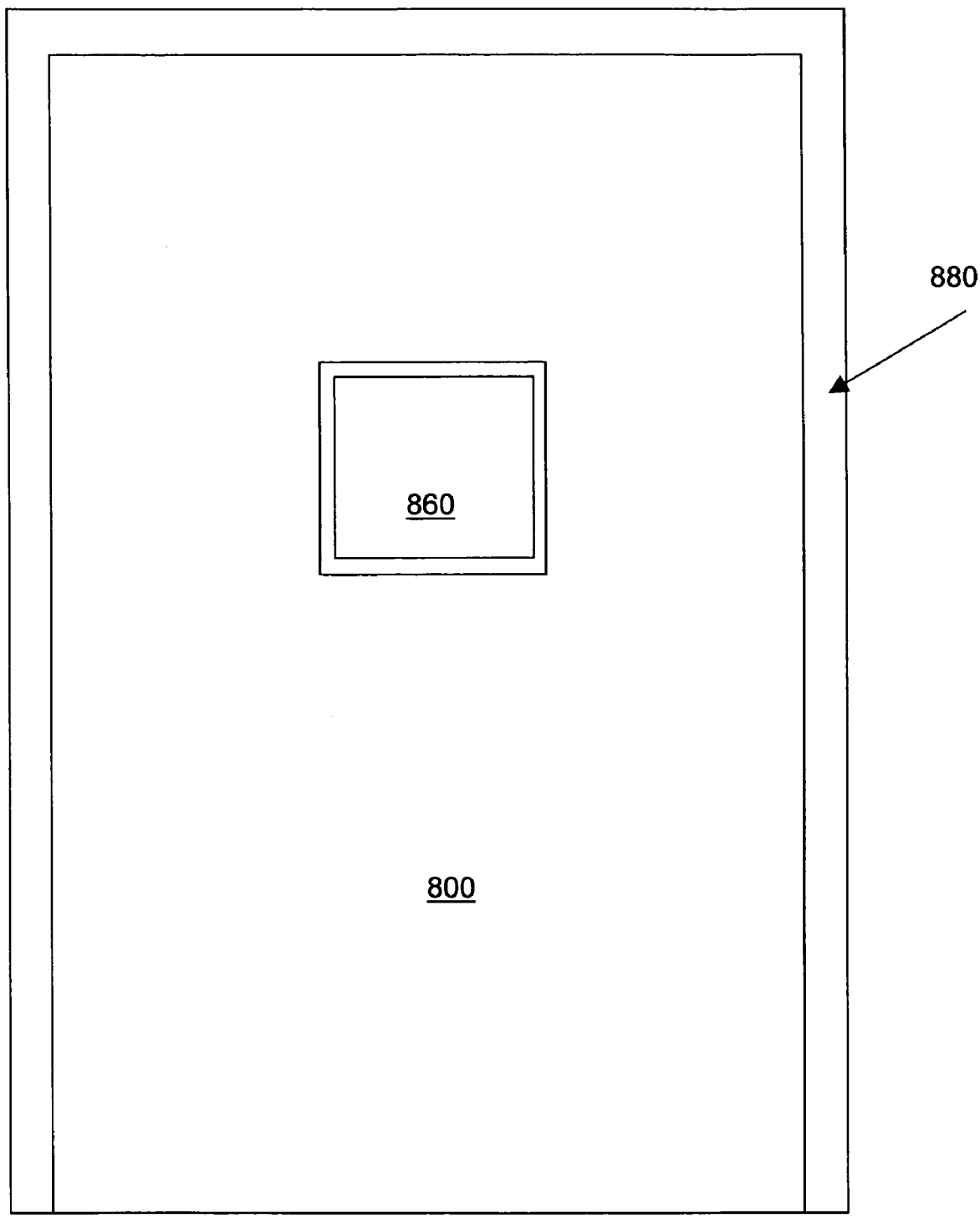
FIG. 8 is a front view of a radiation shielding fire rated door according to another embodiment of the present invention.

FIG. 8 depicts a door including a window according to another embodiment of the present invention. Door 800 is constructed in a similar manner as door 100 and is provided in frame 880. Door 800 includes window 860. Window 860 may include lead shielding, as is apparent to one of ordinary skill in the art. Additional supporting structure may be provided in the area of window 860 to ease in its installation.

It will be apparent to those skilled in the art that doors of all embodiments of the invention can be manufactured in a manner similar to that used to manufacture door 100, as described herein.

Other embodiments, uses, and advantages of the present invention will be apparent to those skilled in the art from consideration of the specification and practice of the invention disclosed herein. The specification and examples should be considered exemplary only.

What is claimed is:

1. A radiation shielding door having a fire rating, comprising:
    a non-combustible core having a first face, a second face;
    a supporting material in contact with the non-combustible core;
    a first radiation shield in contact with the first face of the non-combustible core; and
    an intumescent material in contact with the supporting material.

2. The radiation shielding door of claim 1, further comprising:
    a second radiation shield in contact with the second face of the non-combustible core.

3. The radiation shielding door of claim 2, further comprising:
    a first cover in contact with the first radiation shield; and
    a second cover in contact with the second radiation shield.

4. The radiation shielding door of claim 1, wherein the non-combustible core comprises a mineral core.

5. The radiation shielding door of claim 4, wherein the mineral core comprises calcium silicate.

6. The radiation shielding door of claim 1, wherein the radiation shield comprises lead.

7. The radiation shielding door of claim 1, wherein the supporting material comprises Tectonite™.

8. The radiation shielding door of claim 1, wherein the radiation shielding door has a fire rating of at least 45 minutes.

9. The radiation shielding door of claim 8, wherein the radiation shielding door has a fire rating of at least 1 hour.

* * * * *

UNITED STATES PATENT AND TRADEMARK OFFICE
CERTIFICATE OF CORRECTION

PATENT NO. : 7,598,460 B2  Page 1 of 1
APPLICATION NO. : 11/260168
DATED : October 6, 2009
INVENTOR(S) : Roberts, IV et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 608 days.

Signed and Sealed this

Twenty-eighth Day of September, 2010

David J. Kappos
*Director of the United States Patent and Trademark Office*